United States Patent [19]
Keller et al.

[11] Patent Number: 6,051,151
[45] Date of Patent: Apr. 18, 2000

[54] APPARATUS AND METHOD OF PRODUCING A NEGATIVE ION PLASMA

[75] Inventors: John H. Keller, Newburgh; Dennis K. Coultas, Hopewell Junction, both of N.Y.

[73] Assignee: International Business Machines Corporation, Armonk, N.Y.

[21] Appl. No.: 08/968,194

[22] Filed: Nov. 12, 1997

[51] Int. Cl.$^7$ ...................................................... H05H 1/00
[52] U.S. Cl. ........................... 216/68; 438/729; 438/732; 118/723 I; 118/723 IR; 156/345
[58] Field of Search ....................... 216/67, 68; 156/345; 438/732, 729; 118/723 I, 723 IR

[56] References Cited

U.S. PATENT DOCUMENTS

| 4,842,707 | 6/1989 | Kinoshita | 156/345 |
| 5,444,207 | 8/1995 | Sekine et al. | 156/345 |
| 5,556,521 | 9/1996 | Ghanbari | 118/723 I |

OTHER PUBLICATIONS

O. Fukuma et al..; "Relationship Between Extraction of H–Ions Optimized by Plasma Grid Potential & Plasma Parameters in a Bucket Source"; Rev. Sci. Instrum. 63 (4); Apr., 1992; pp. 2696–2698.

M. Hanada et al.; "114cm X 36cm vol. Negative Ion Source Producing Multi–Ampere Ion Beams"; Rev. Sci. Instrum. 61 (1), Jan., 1990; pp. 499–501.

Y. Yoshida; "Reduction of Charge–Up Damage in Magnetron RIE"; Electrochemical Society Proceedings; vol. 95–5; pp. 236–245.

*Primary Examiner*—Thi Dang
*Attorney, Agent, or Firm*—Whitham, Curtis & Whitham; Jay Anderson

[57] ABSTRACT

An apparatus and method of producing a negative ion plasma for use in manufacturing of microelectronic devices, particularly etching of microelectronic patterns in semiconductor wafers. A negative ion plasma is produced from a hot electron plasma formed by a RF or UHF plasma source. The negative ion plasma includes positive ions, negative ions and relatively cold electrons, such electrons having an effective electron temperature or average energies less than that for maintaining the plasma. The fields producing the hot plasma are isolated from the negative ion plasma in a cold plasma region by a magnetic filter. The magnetic filter confines the plasmas to provide plasma uniformity at a work piece being etched by the negative ion plasma. The magnetic filter further prevents hot electrons originating in the hot electron plasma from diffusing into the negative ion plasma, while allowing positive ions and cold electrons to diffuse from the hot plasma to the negative ion plasma. An RF bias on the work piece accelerates the positive ions, electrons and/or negative ions to the work piece being etched.

25 Claims, 6 Drawing Sheets

APPARATUS AND METHOD OF PRODUCING A NEGATIVE ION PLASMA

RELATED APPLICATION

The present invention is related to U.S. patent application Ser. No. 08/595,438 entitled "Negative Ion Inductive Source For Etching High Aspect Ratio Structures" to John H. Keller, assigned to the assignee of the present application and incorporated herein by reference.

BACKGROUND OF THE INVENTION

1. Field of the Invention

The present invention is related to plasma processing of semiconductor wafers during the manufacture of semiconductor wafers and, more particularly, to an apparatus and a method for producing a uniform negative ion plasma for plasma processing.

2. Background Description

U.S. patent application Ser. No. 08/595,438 entitled "Negative Ion Inductive Source For Etching High Aspect Ratio Structures" to John H. Keller, teaches a method and apparatus for forming high aspect ratio structures in a semiconductor wafer wherein a series of magnets is disposed between hot and cold plasma regions. A magnetic field from the series of magnets is used to reduce hot electron diffusion, thereby producing a uniform negative ion plasma. The negative ion plasma is used to etch the workpiece.

Reactive Ion Etch (RIE), such as taught in Keller, is used to form shapes on semiconductor wafers. In a typical RIE process, radio frequency (RF) or microwave power is used to excite a gas to form a plasma. The plasma facilitates etching the shapes into the wafer. A typical use of a RIE process is in etching very fine holes, typically minimum dimension sized holes, through a layer, e.g., an insulating layer, to an underlying layer, commonly referred to as "opening contacts" or "opening vias" through the layer. RIE is also used to open minimum width trenches through one or more wafer layers. Typically, these minimum dimension shapes are deeper than at least one of their surface dimensions, and so, have a high aspect ratio.

Charging effects from ionic charging, known as aspect ratio charging effects, occur at the bottom of these high aspect ratio structures, especially, if some part of the structure is an insulator. These aspect ratio charging effects include oxide damage, device damage, threshold voltage shifts, polysilicon notching and reduction of ion current at the bottom of trenches and at the bottom of vias that impedes or even stops etching (known as RIE lag).

Thus there is a need to eliminate aspect ratio charging effects.

SUMMARY OF THE INVENTION

It is a purpose of this invention to reduce the aspect ratio charging effects in an etching system;

It is another purpose of this invention to reduce the electron temperature and the electron density relative to the positive ion density in the plasma above a work piece being etched;

It is yet another the purpose of this invention to define an external magnetic means for producing a magnetic filter.

The present invention is a tool for reactive ion etching features into a wafer using a negative ion plasma in a region over the wafer. This negative ion plasma is filtered from the hot electron plasma using a magnetic filter which contains the hot electron plasma in a hot plasma region and allows positive ions and cold electrons to diffuse into a cold plasma region, forming a negative ion plasma there. The negative ion plasma etches the wafer. The hot electron plasma may be produced by an inductive, helicon, ultra high frequency (UHF), electron cyclotron resonance (ECR) or magnetron plasma source. The external magnet is a dipole magnet or, magnets arranged to form parts of a magnetic dipole magnet.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
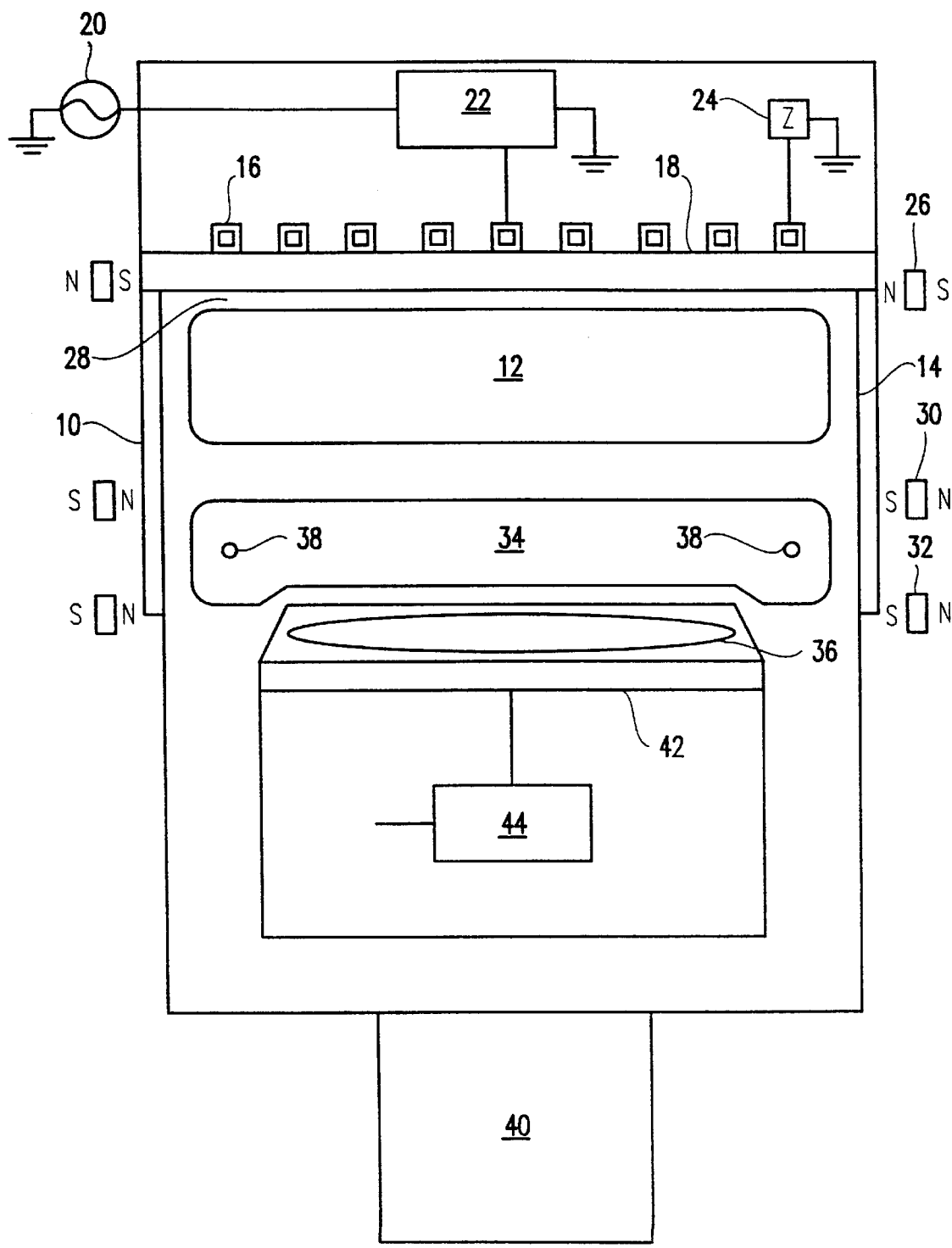
FIG. 1 is a schematic block diagram of a vertical cross section of a first preferred embodiment of the invention.

Referring now to the drawings, and more particularly to FIG. 1, which is a schematic block diagram of a first preferred embodiment 10 of the present invention, magnets external to an etching chamber cooperate to produce a larger magnetic field near the workpiece than the individual magnets would normally produce.

Thus, in a first preferred embodiment apparatus 10, hot electron plasma in a hot plasma region 12 is produced in a chamber 14 by a hot plasma source 16, in this first embodiment, a radio frequency (RF) induction coil. The hot plasma source 16 may be an inductive, helicon, electron cyclotron resonance (ECR), ultra high frequency (UHF) or magnetron type plasma source. Thus, the radio frequency may range from as low as two megahertz (2 MHz) up to microwave frequencies.

The RF induction coil 16 is separated from the hot electron plasma in hot plasma region 12 by a dielectric window 18. A RF source 20 and matching network 22 drive RF induction coil 16 which is grounded through impedance 24. Optional magnet 26, which generates a small magnetic field 28 above hot plasma region 12, may be included to aid in producing the hot electron plasma. Small magnetic field 28 should be slightly larger than the ECR field for the RF frequency. The ECR field for 13.56 MHZ, the preferable induction coil operating RF frequency, is 5 Gauss. In this preferred embodiment, magnets 30 and 32 cooperate to produce a larger magnetic filter field (shown in FIG. 2 and discussed hereinbelow) producing a negative ion plasma in cold plasma region 34 at the work piece 36. The negative ion plasma includes positive ions, negative ions and relatively cold electrons, such electrons having an effective electron temperature or average energies less than normally required for maintaining the plasma.

Discharge gas is provided to the chamber 14 through ring 38 and is pumped out of the chamber 14 by pump 40. The work piece, typically a wafer, can be electrostatically or mechanically clamped to chuck 42, which also is an electrode driven by RF bias supply and matching network 44. The RF bias should be selected at a frequency that is low enough (between 0.2 and 1 MHz) to avoid any significant heating of electrons in the negative ion plasma in cold plasma region 34. Also, the preferred RF bias wave shape is such that its positive part is narrower and larger than its negative part.

Figure 2:
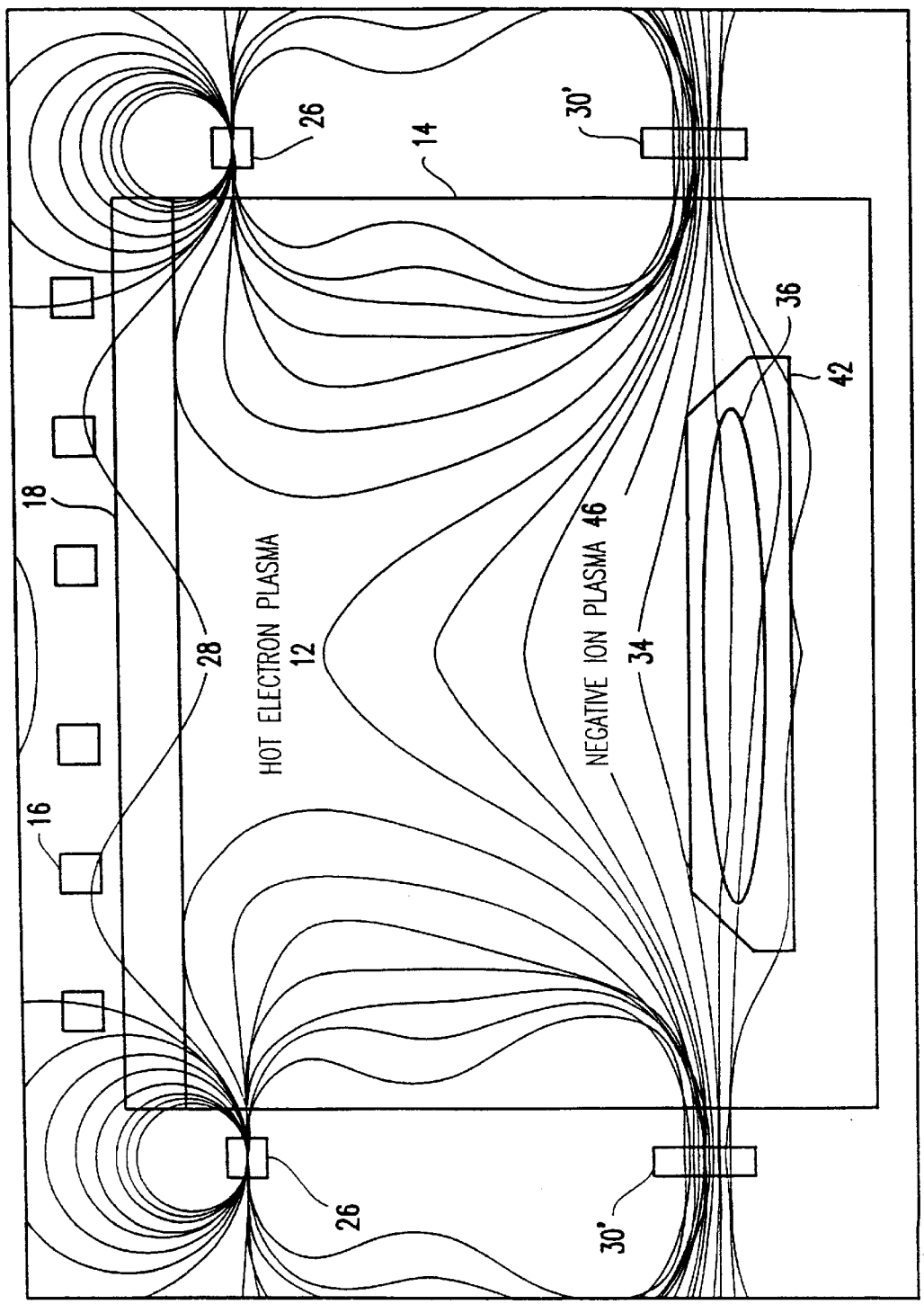
FIG. 2 shows the magnetic field lines through the plasma regions in a vertical cross section of an alternate embodiment.

FIG. 2 shows the magnetic field lines in the chamber 14 of an alternate embodiment at the plasma regions 12 and 34. For more convenient wafer access, the chamber 14 includes two sets of magnets 30 and 32 as shown above. However, in this embodiment, a single set of magnets 30' replaces two sets of magnets 30 and 32.

Magnets 30 and 32 or, alternatively, 30' produce magnetic field lines 46 while magnets 26 produce magnetic field 28. The direction of field 28 is opposite that of field 46. Field lines 46 are substantially parallel to wafer 36. Field 46 greatly reduces the diffusion of hot electrons from hot electron plasma 12 to colder negative ion plasma region 34, while at the same time, allowing the positive ions and cold electrons to diffuse from hot electron plasma 12 and produce the negative ion plasma 34. Field 46 should be nearly parallel to the surface of work piece 36 and its strength should be such that, the integral of the field down to the wafer 36 is on the order of 200 Gauss cm. The field between magnetic fields 28 and 46 should be small enough so that the RF field lines from coil 16 are cut off and prevented from penetrating to negative ion plasma 34.

Figure 3:
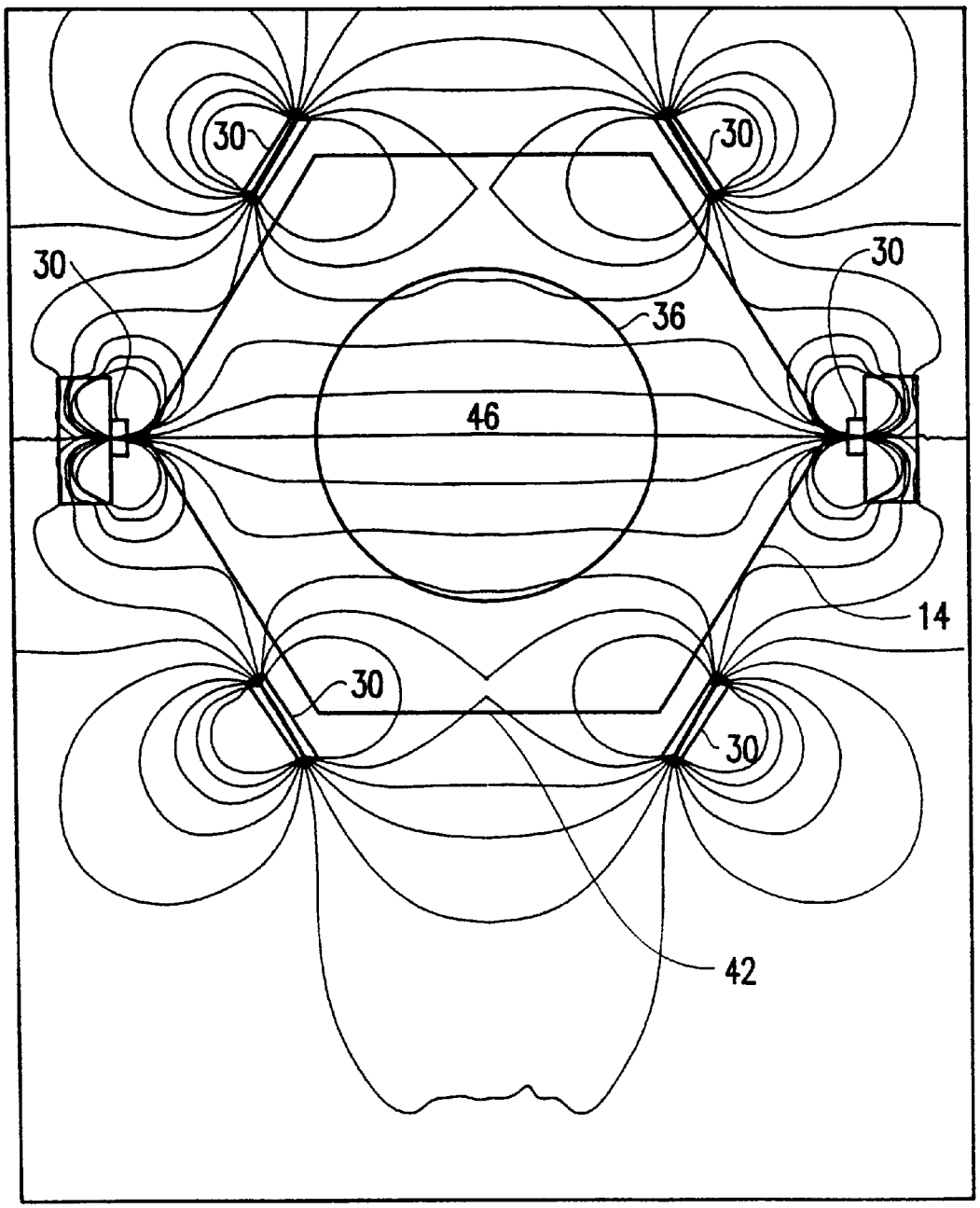
FIG. 3 shows the magnetic field lines over a work piece in horizontal cross section of a preferred embodiment chamber.

FIG. 3 is a top view of a workpiece (wafer 36) in place on the chuck 42, illustrating magnetic field lines just above the wafer 36 in the chamber 14. The field produced by magnets 30 and 32 or, alternatively, 30', is nearly uniform over the wafer 36. Magnets 30 are shown in the perimeter of the vacuum housing chamber 14, which in this example is hexagonal, although it may be any shape. Magnets 30 and 32 or, alternatively, 30' are arranged to form dipole ring magnets around the chamber 14. Magnets 26 and 30, 32 (or 30') each produce a magnetic field in the chamber 14 such that as a circle is traced around the chamber's perimeter, the direction of the magnetic field rotates a total of 720 degrees.

Figure 4:
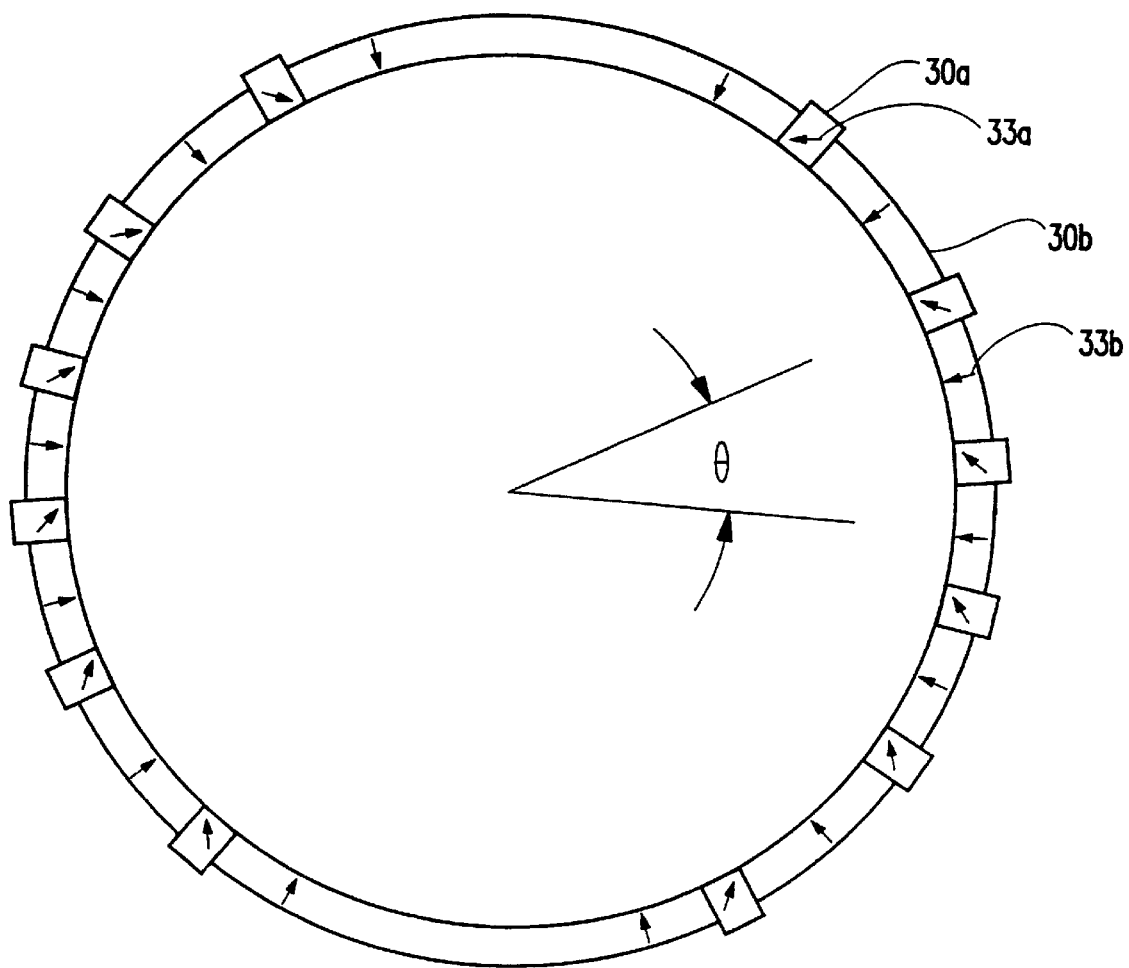
FIG. 4 shows the preferred multipole magnet including the discrete magnets of the ring magnet and magnets for multipole confinement of plasmas.

Preferably, ring magnets 26, 30 and 32, as shown in FIG. 4 for ring magnet 30, includes multiple dipole or, multipole magnets. Thus, each ring magnet includes magnets for multipole confinement of plasmas in plasma regions 34 and 12, in addition to the discrete magnets of the ring magnet shown in FIG. 3. It is the resulting negative ion plasma from this multipole magnet confinement that is uniform over the wafer 36. This multipole confinement ring is, preferably, a nearly continuous ring of multipole magnets (known as a ring cusp) that surround plasma in plasma regions 34 and 12.

In the example of ring magnet 30 in FIG. 4, magnets 30A, are shown as larger in the radial direction (i.e., thicker) than magnets 30B. The ring magnet and magnets 30A and 30B cooperate to form a surface confinement field that is nearly continuous in the azimuthal direction. The direction of the magnetic field of the individual magnets 30A, 30B is shown by arrows 33A and 33B. For the preferred arrangement of vertically adjacent rings 30 and 32, the direction of magnetization 33B alternates between rings, i.e. in and out.

For the ring magnet, the magnetic fields from the individual magnets are additive, summing in the center of the chamber 14, to produce magnetic filter field 46. However, the ring cusp magnet only produces a surface field at the inner surface of the chamber 14, and in the center of the chamber 14, effectively cancels itself out.

Further, although shown external to the chamber 14 in the figures, these ring cusp/ring magnets (30A, 30B) in rings 26, 30 and 32 may be placed just inside the wall of chamber 14. Also, the preferred number of cusp magnets or ring magnets, is 3 or 4, although any desired number may be used. The particular number of magnets is inconsequential so long as the result is good plasma confinement, cusp fields with a magnitude less than 10 Gauss at the wafer and magnetic fields 46 and 52 in FIG. 5 (described hereinbelow) are produced.

Optionally, ring magnets 26, 30 and 32 could be, simply, a continuous cusp magnet in combination either with a continuous ring magnet or with discrete dipole magnet sections, such as in FIG. 3. However, in this optional arrangement, both the strength and direction of magnetization would vary around the ring. However, the ring shown in FIG. 4 is preferred because it is simpler and because it is made up of the cusp magnets and discrete parts of a ring magnet having azimuthal spacing proportional to 1/cos θ, where θ is the as shown in FIG. 4.

Figure 5:
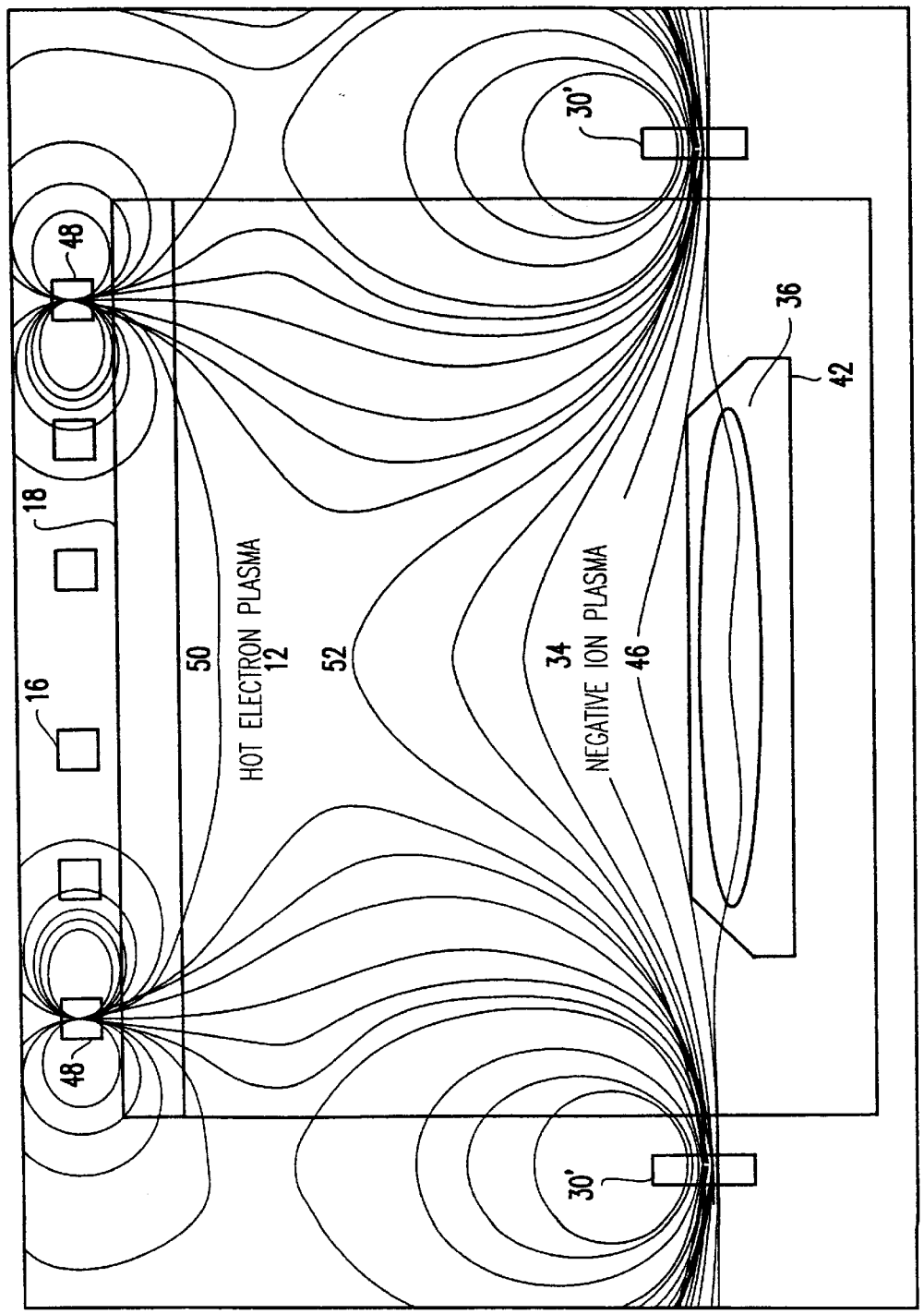
FIG. 5 shows the magnetic field lines through the plasma regions in vertical cross section of an alternate embodiment chamber.

FIG. 5 is an alternate embodiment, wherein optional magnets 48, which produce a field 50 equivalent to that produced by magnets 26 of FIG. 1. However, in this alternate embodiment, magnets 48 are placed above hot plasma region 12 and internal to RF coil 16. Again, the magnetic field 50 above magnetic field lines 46 must be small enough and the region in the chamber large enough that the RF field from the plasma source 16 producing the hot electron plasma in hot plasma region 12, does not penetrate into the cold plasma region 34. This is necessary to avoid having the field from the plasma source 16 heating electrons in cold region 34. This condition essentially corresponds to requiring that the ECR frequency of the magnetic field 52 above field lines 46 being less than the frequency of the RF or UHF plasma source 16 and its width being greater than twice the skin depth at this magnetic field strength at 52. Thus, for 500 MHz, the ECR magnetic field would be 178 Gauss. So, at least for a UHF source 16 the field 52 can have the same magnitude as magnetic field 46.

Figure 6:
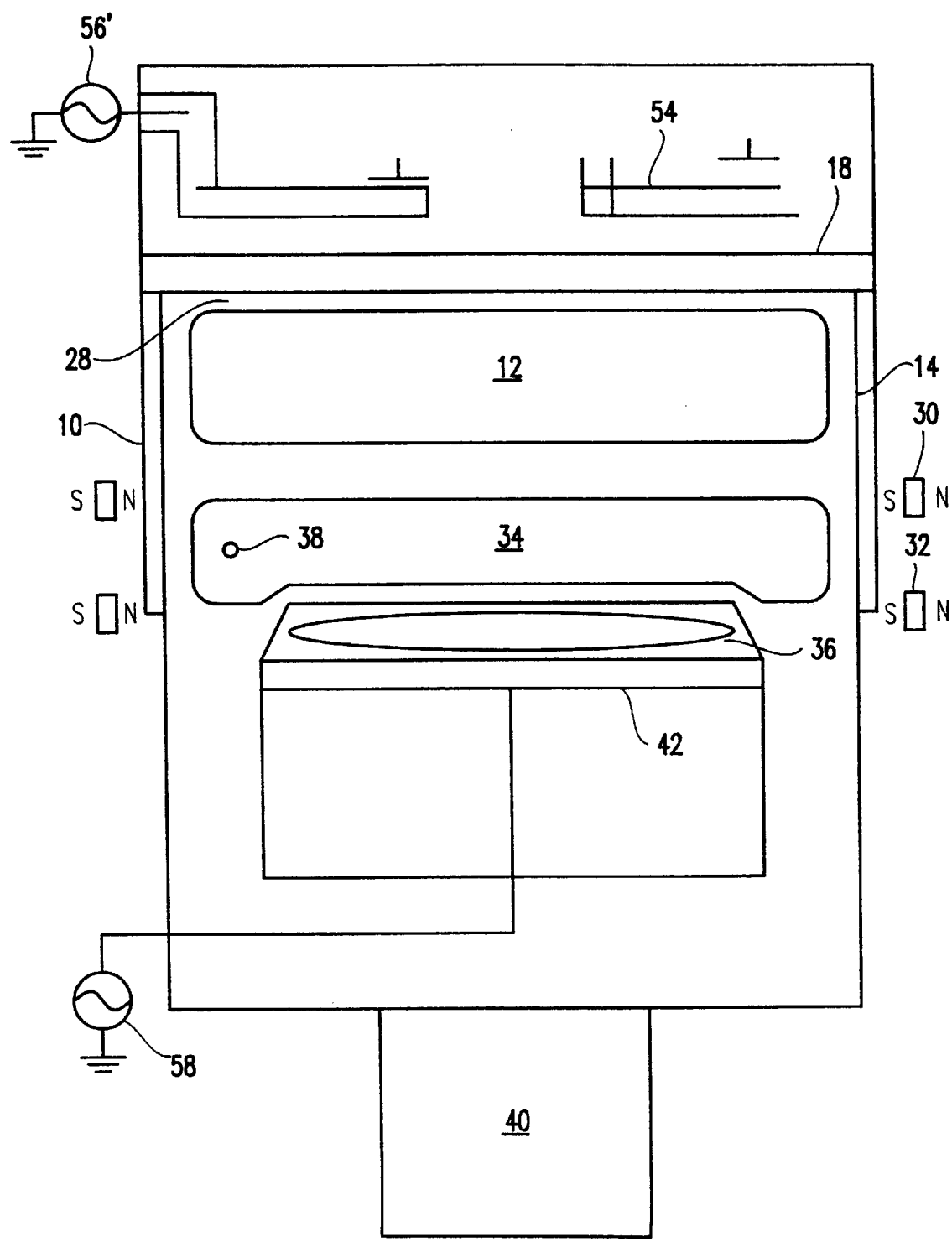
FIG. 6 is a schematic block diagram of a vertical cross section of a second preferred embodiment of the invention.

FIG. 6 is yet another preferred embodiment with an UHF hot plasma source, where the frequency is greater than the ECR for the magnetic field in the upper region of the magnetic filter. The UHF hot plasma source includes an antenna 54 that sets on dielectric window 18 and is powered by UHF source 56. Magnets 30 and 32 form the magnetic filter that produce magnetic field 46 at the wafer 36 and magnetic field 28 at the dielectric window 18. Alternatively, the UHF source 56 may be any well known ECR source. The wafer 36 is driven by a low frequency RF source 58.

While the invention has been described in terms of preferred embodiments, those skilled in the art will recognize that the invention can be practiced with modification within the spirit and scope of the appended claims.

We claim:

1. A method of etching a work piece with a negative ion plasma comprising the steps of:

disposing a work piece on a chuck in an etching chamber;

applying an RF bias to said chuck, said RF bias biasing said work piece;

generating a hot electron plasma in a hot plasma region within said etching chamber;

generating a negative ion plasma in a cold plasma region at said chuck within said etching chamber, said cold plasma region being separated from said hot plasma region by a magnetic field, said magnetic field being formed by a dipole ring magnet, said dipole ring magnet being circumferentially disposed external to and between said hot plasma region and said cold plasma region, whereby plasma from said hot electron plasma diffuses through said magnetic field to form said negative ion plasma in said cold plasma region, said negative ion plasma being uniform over said work piece;

etching said work piece with said negative ion plasma.

2. The method of claim 1 wherein the dipole ring magnet is placed external to the chamber.

3. The method of claim 1 wherein the dipole ring magnet is placed in the chamber, at the chamber's inner surface.

4. The method of claim 1 wherein the dipole ring magnet comprises two or more dipole ring magnets cooperating to contain said hot electron plasma in said hot plasma region and to generate said negative ion plasma in said cold plasma region.

5. The method of claim 4 wherein two or more dipole ring magnets is two dipole ring magnets.

6. The method of claim 1 wherein the dipole ring magnet includes a plurality of multipole magnets.

7. The method of claim 1 wherein the step of generating the hot electron plasma comprises:

applying a radio frequency to an induction coil at an exterior surface of said chamber.

8. The method of claim 7 wherein the radio frequency is 13.56 MHz.

9. The method of claim 1 wherein the RF bias on the chuck is between 0.2–1 MHz.

10. A magnetic apparatus for producing a negative ion plasma for etching a work piece comprising:

a primary plasma source;

a hot plasma region, said primary plasma source generating a hot electron plasma in said hot plasma region;

a dipole ring magnet below said hot plasma region, a magnetic field from said dipole ring magnet separating said hot plasma region from a cold plasma region;

a work piece chuck in said cold plasma region, said work piece chuck serving to hold a work piece being etched by a negative ion plasma in said cold plasma region; and an RF source connected to said work piece chuck, plasma from said hot electron plasma diffusing through said magnetic field to form said negative ion plasma in said cold plasma region, said negative ion plasma being uniform over said work piece.

11. The magnetic apparatus of claim 1 wherein magnetic force lines from said magnetic field are substantially parallel to any said work piece held on said chuck.

12. The magnetic apparatus of claim 11 wherein said dipole ring magnet includes a ring cusp magnet.

13. The magnetic apparatus of claim 3 wherein said dipole ring magnet is two or more dipole ring magnets circumferentially arranged around said cold plasma region, said two or more dipole ring magnets cooperatively forming said magnetic field.

14. The magnetic apparatus of claim 13 wherein said two or more dipole ring magnets is two dipole ring magnets.

15. The magnetic apparatus of claim 12 wherein the integral of the magnetic field down to said work piece is 100–500 Gauss cm.

16. The magnetic apparatus of claim 15 wherein the integral of the magnetic field down to said work piece is 200 Gauss cm.

17. The magnetic apparatus of claim 15, wherein the dipole ring magnet is a first dipole ring magnet, said magnetic apparatus further comprising:

a second dipole ring magnet forming a second magnetic field above said hot plasma region.

18. The magnetic apparatus of claim 17 wherein the first and second dipole ring magnets each comprise a plurality of discrete dipole ring magnet sections and a plurality of multipole magnets.

19. The magnetic apparatus of claim 18 wherein the plurality of discrete dipole ring magnet sections contain the magnetic field of said plurality of multipole magnets such that the field from the plurality of multipole magnets is nearly continuous around the ring.

20. The magnetic apparatus of claim 17 wherein the primary plasma source is selected from the group consisting of inductive, helicon, ECR, UHF or magnetron type of plasma sources.

21. The magnetic apparatus of claim 20 wherein the primary plasma source is a radio frequency induction coil.

22. The magnetic apparatus of claim 21 wherein the RF induction coil is operated at 13.56 MHz.

23. The magnetic apparatus of claim 20 wherein the magnetic field formed by the first dipole ring magnet is opposite the second ring magnet's field's direction.

24. The magnetic apparatus of claim 20 wherein the chuck is biased by a RF bias between 0.2–1 MHz.

25. The magnetic apparatus of claim 20 wherein the primary plasma source is a ultra high frequency antenna disposed above said hot electron plasma.

* * * * *